(12) United States Patent
Crofoot et al.

(10) Patent No.: US 9,190,746 B2
(45) Date of Patent: Nov. 17, 2015

(54) HIGH-VOLTAGE RESISTANCE FOR A CONNECTOR ATTACHED TO A CIRCUIT BOARD

(75) Inventors: Larry Crofoot, Perry, OH (US); John T. Venaleck, Painesville, OH (US)

(73) Assignee: Cardioinsight Technologies, Inc., Cleveland, OH (US)

( * ) Notice: Subject to any disclaimer, the term of this patent is extended or adjusted under 35 U.S.C. 154(b) by 100 days.

(21) Appl. No.: 14/115,581

(22) PCT Filed: May 3, 2012

(86) PCT No.: PCT/US2012/036271
§ 371 (c)(1),
(2), (4) Date: Feb. 10, 2014

(87) PCT Pub. No.: WO2012/151371
PCT Pub. Date: Nov. 8, 2012

(65) Prior Publication Data
US 2014/0148023 A1 May 29, 2014

Related U.S. Application Data

(60) Provisional application No. 61/481,855, filed on May 3, 2011.

(51) Int. Cl.
*H01R 12/51* (2011.01)
*H05K 3/34* (2006.01)
*H01R 12/72* (2011.01)
*H01R 107/00* (2006.01)
(Continued)

(52) U.S. Cl.
CPC ............. *H01R 12/51* (2013.01); *H01R 12/721* (2013.01); *H05K 3/3405* (2013.01); *H01R 12/57* (2013.01); *H01R 12/712* (2013.01); *H01R 12/725* (2013.01); *H01R 12/727* (2013.01); *H01R 2107/00* (2013.01); *H05K 2201/10189* (2013.01); *H05K 2201/10409* (2013.01)

(58) Field of Classification Search
CPC ........... H01R 23/7073; H01R 23/7068; H01R 23/6873; H01R 13/63805; H05K 1/117; H01L 2924/01079
See application file for complete search history.

(56) References Cited

U.S. PATENT DOCUMENTS 4,109,298 A * 8/1978 Hanni et al. ................... 361/803
4,734,045 A * 3/1988 Hawkins .......................... 439/79
4,921,453 A * 5/1990 O'Brien ........................ 439/630

(Continued)

FOREIGN PATENT DOCUMENTS

EP 1953871 A2 8/2008
JP 2000294321 A 10/2000
(Continued)

OTHER PUBLICATIONS

PCT Int'l Search Report and Written Opinion—8 pgs, Nov. 16, 2012, CardioInsight Technologies, Inc.

*Primary Examiner* — Gary Paumen
(74) *Attorney, Agent, or Firm* — Tarolli, Sundheim, Covell & Tummino LLP

(57) ABSTRACT

A circuit board connector is disclosed that has isolator ribs between contact tails, and slots in the edge of a circuit board between circuit pads that communicate with the ribs to avoid pad-to-pad current leakage and high-voltage breakdown. The slots may be between individual circuit board fingers that each include one of the conductor pads.

12 Claims, 3 Drawing Sheets

(51) Int. Cl.
*H01R 12/57* (2011.01)
*H01R 12/71* (2011.01)

(56) References Cited

U.S. PATENT DOCUMENTS

| | | | | |
|---|---|---|---|---|
| 4,969,842 | A | * | 11/1990 | Davis ............................ 439/629 |
| 5,484,965 | A | * | 1/1996 | Woychik ........................ 174/262 |
| 5,599,595 | A | * | 2/1997 | McGinley et al. ............... 428/33 |
| 5,663,870 | A | * | 9/1997 | Kerndlmaier ................... 361/763 |
| 5,963,045 | A | * | 10/1999 | Zink et al. ................. 324/750.16 |
| 6,296,499 | B1 | * | 10/2001 | Hermann et al. ............. 439/181 |
| 6,666,705 | B1 | * | 12/2003 | Lauruhn et al. ............... 439/377 |
| 6,765,804 | B2 | * | 7/2004 | Hudson et al. ................. 361/799 |
| 7,018,224 | B2 | * | 3/2006 | Reisinger et al. .............. 439/181 |
| 7,232,331 | B2 | * | 6/2007 | Dennes et al. ............... 439/404 |
| 7,762,818 | B2 | * | 7/2010 | Hoang ............................ 439/62 |
| 8,002,555 | B2 | * | 8/2011 | Lee ................................ 439/49 |
| 8,043,120 | B2 | * | 10/2011 | Tsai et al. ..................... 439/629 |
| 8,585,436 | B2 | * | 11/2013 | Tabuchi et al. ................ 439/516 |
| 8,641,453 | B2 | * | 2/2014 | Jung et al. ..................... 439/637 |
| 8,662,917 | B2 | * | 3/2014 | Wang et al. .................... 439/497 |

FOREIGN PATENT DOCUMENTS

| | | |
|---|---|---|
| JP | 2009/070988 A | 4/2009 |
| WO | WO 2009/099926 A2 | 8/2009 |

* cited by examiner

US 9,190,746 B2

HIGH-VOLTAGE RESISTANCE FOR A CONNECTOR ATTACHED TO A CIRCUIT BOARD

This application is a U.S. National Stage Application filed under 35 U.S.C. §371 of PCT/US2012/036271, having a filing date of May 3, 2012, which claims the benefit of U.S. Provisional Patent Application No. 61/481,855, filed on May 3, 2011, and entitled HIGH-VOLTAGE RESISTANCE FOR A CONNECTOR ATTACHED TO A CIRCUIT BOARD. The entire contents of each of the above-identified patent applications are incorporated herein by reference.

BACKGROUND

Printed circuit boards often have electrical connectors attached at one edge by soldering the tails of the connector to pads provided at the edge of the board. The distance between adjacent tails and between adjacent pads is often small and will not sustain high voltage without current leakage or voltage breakdown. It is desirable to provide a connector design that allows soldered connection to the edge of a circuit board that is resistant to current leakage and voltage breakdown when a high voltage appears between the pads.

SUMMARY OF THE INVENTION

According to one aspect of the invention, rectangular pads are provided on the surface along one edge of a circuit board. These pads are in close array and do not extend to the edge of the board. The pads extend into the board a finite distance.

According to another aspect of the invention, pads on the edge of a circuit board have vias located centrally to provide electrical communication with layers of circuits within the board, not on the surface.

According to yet another aspect of the invention, rectangular slots in the circuit board are provided between the pads and extend from the edge of the board inwardly beyond the depth of the pads.

According to an aspect of this invention, a connector has ribs between output tails that extend some finite distance beyond the tails.

According to another aspect of the invention, ribs between contact tails of a connector fit into slots provided in a printed circuit board.

According to another aspect of the invention, the tails of the connector fit the pads of the circuit board and are soldered therein.

According to another aspect of the invention, the combination of ribs and slots provide an extended isolation path preventing current leakage and voltage breakdown.

According to yet another aspect of the invention, a combination of a circuit board and a connector mounted on an edge of the circuit board, may include one or more of the following features: the circuit board has contact pads away from the edge; the contact pads are on individual circuit board fingers; slots, such as rectangular slots, are between adjacent circuit board fingers; the slots have a depth that extends further from the edge than do the contact pads; the contact pads have respective conductive vias that electrically connect the conductive pads to circuitry of the circuit board; the circuitry is within (inside) the circuit board, as opposed to being on a surface of the circuit board; the connector has ribs alternating with contact tails that are configured to engage the contact pads; the ribs are parts of a plastic connector body of the connector; the connector body is a single molded plastic piece; the ribs enter the slots when the connector is coupled to the circuit board; the ribs are between adjacent contact pads, extending the isolation path between the adjacent contact pads; and the combination of the ribs and the slots provides an extended isolation path preventing current leakage and voltage breakdown.

According to another aspect of the invention, a device includes: a circuit board; and a connector mounted on an edge of the circuit board. The circuit board has contact pads away from an edge of the circuit board that is closet to the connector. The connector has the connector has ribs alternating with contact tail. The contact tails engage the contact pads.

According to yet another aspect of the invention, a circuit board includes: circuit board fingers with slots therebetween; and contact pads, away from an edge of the circuit board, on the circuit board fingers.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The annexed drawings, which are not necessarily to scale, show various features of the invention.

DETAILED DESCRIPTION

A circuit board connector is disclosed that has isolator ribs between contact tails, and slots in the edge of a circuit board between circuit pads that communicate with the ribs to avoid pad-to-pad current leakage and high-voltage breakdown. The slots may be between individual circuit board fingers that each include one of the conductor pads.

Figure 1:
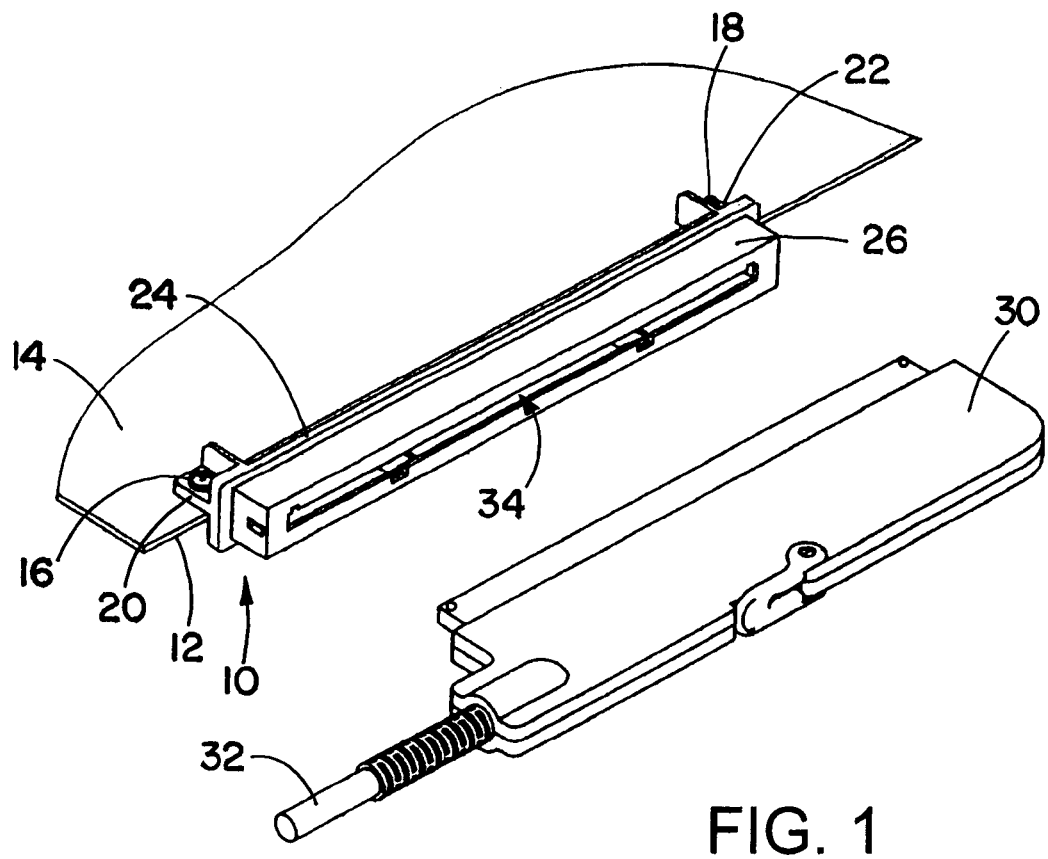
FIG. 1 is an exploded view of a device according to an embodiment of the present invention.

FIG. 1 shows a device that includes a connector 10 that is coupled to an edge 12 of a circuit board 14. The connector 10 has contacts for engaging conductive pads on the circuit board 14, as described in greater detail below. The connector 10 is mechanically coupled to the circuit board by screws 16 and 18 that pass through tabs 20 and 22 of the connector 10. The tabs 20 and 22 are parts of a connector plastic body 24, which may be formed as a single molded piece, and may be made of a suitable plastic that is resistant to high temperatures, such as those produced by soldering. The front of the connector body 24 may be covered by a plastic shroud 26.

The connector 10 is engaged by a mating connector or plug 30. Conductors in a cable 32 are attached to contacts within the plug 30. When the plug 30 is inserted into a receptacle or opening 34 in the connector 10, the contacts of the plug 30 are electrically connected to the contacts of the connector 10.

Figure 2:
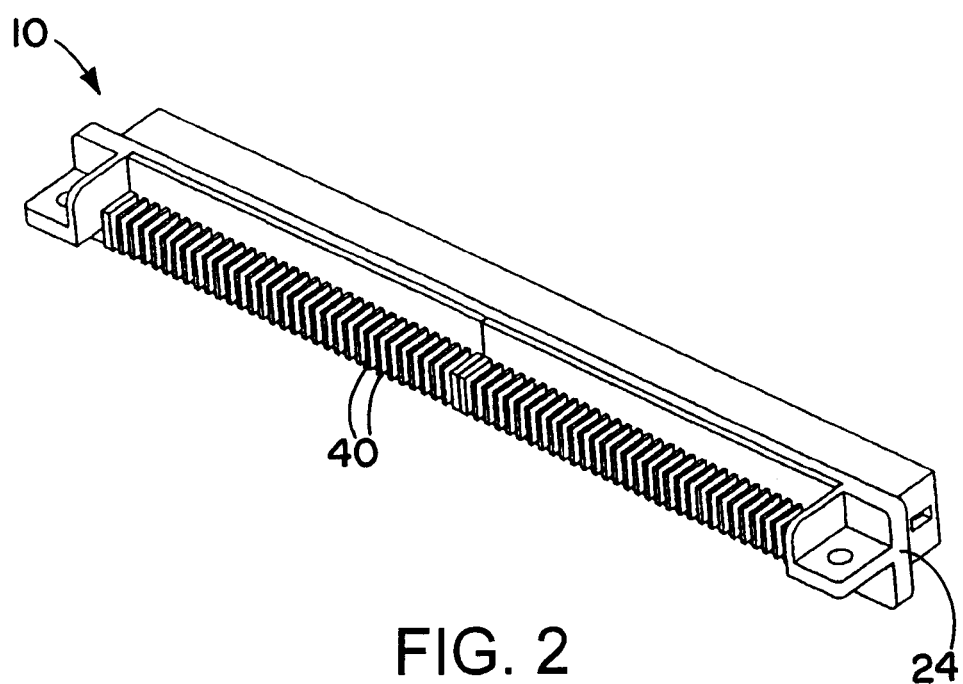
FIG. 2 is an oblique view of a connector of the device of FIG. 1.

FIG. 2 shows the back of the connector 10, the part of the connector 10 that engages the circuit board 14 (FIG. 1). Ribs 40 are between circuit-board-engaging contact tails or ends of the connector 10. The ribs 40 are made of a dielectric material, and may be parts of the molded plastic connector body 24.

Figure 3:
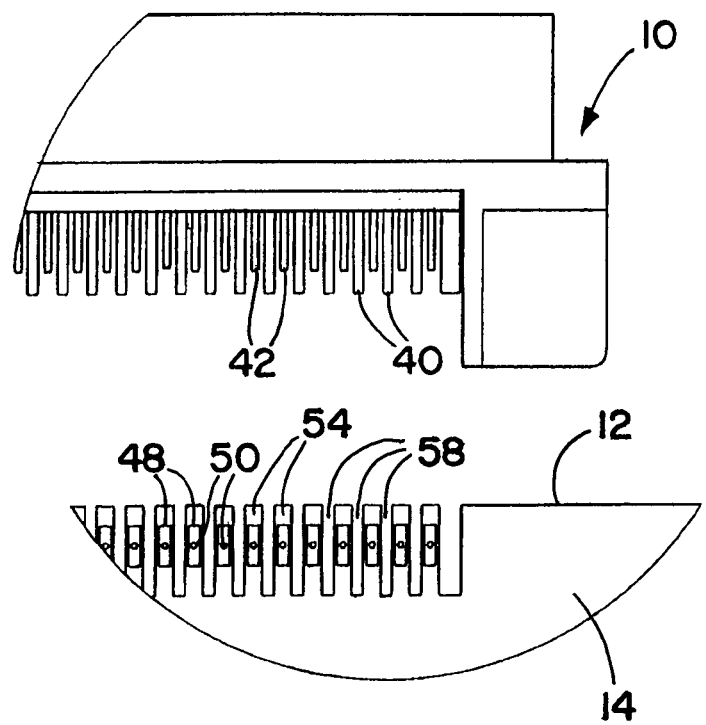
FIG. 3 is an exploded plan view of portions of the device of FIG. 1.

FIG. 3 shows the back of the connector 10 positioned near the edge 12 of the circuit board 14. The ribs 40 of the connector 10 are interspersed between the contact tails or ends 42. The ribs 40 and the contacts tails 42 alternate, with one of the ribs 40 located between each adjacent pair of the tails 42.

The circuit board 14 has contact pads 48 that are used to engage the tails 42 when the connector 10 is installed on the circuit board 14. The contact pads 48 are made of a conductive material, such as a suitable metal, for example copper. Vias 50 are located at the centers of the contact pads 48. The vias 50 are filled with conductive material, such as suitable metal, and provide electrical communication with layers of circuits (not shown) within the circuit board 14, not on the surface of the circuit board 14.

The contact pads 48 are located on individual circuit board fingers 54 of circuit board material, with rectangular slots 58 between adjacent contact pads 48 (between adjacent fingers 54). The slots 58 are configured to receive the ribs 40 when the connector 10 is coupled to the circuit board 14, as is described further below. The contact pads 48 are located away from the circuit board edge 12, such that there are distal portions (free ends) of the fingers 54 onto which the contact pads 48 do not extend. There are also proximal portions of the fingers 54 near the bases of the fingers 54 onto which the contact pads 48 do not extend. The slots 58 thus have a depth that extends beyond the locations of the contact pads 48.

Figure 4:
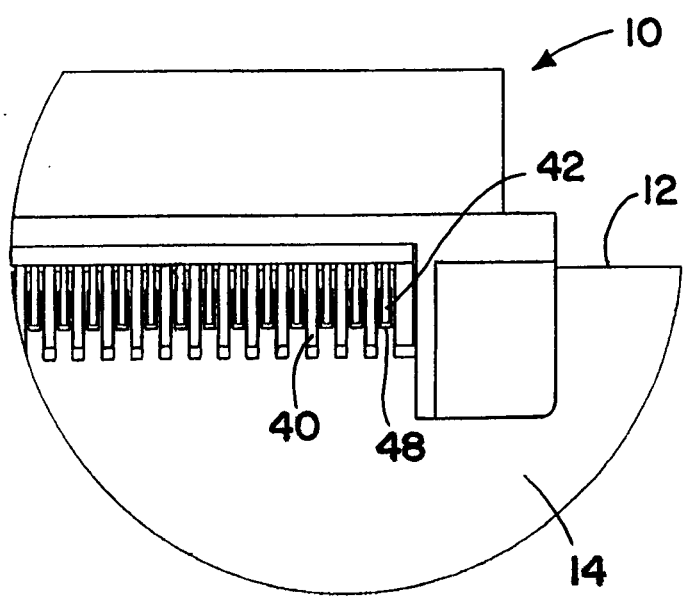
FIG. 4 is a plan view of the portions of FIG. 3, coupled together.

FIG. 4 shows the connector 10 coupled to the circuit board 14. As the connector 10 is engaged with the circuit board 14 the tails 42 align with the contact pads 48. The tails 42 may be permanently attached to the contact pads 48, such as by soldering.

Figure 5:
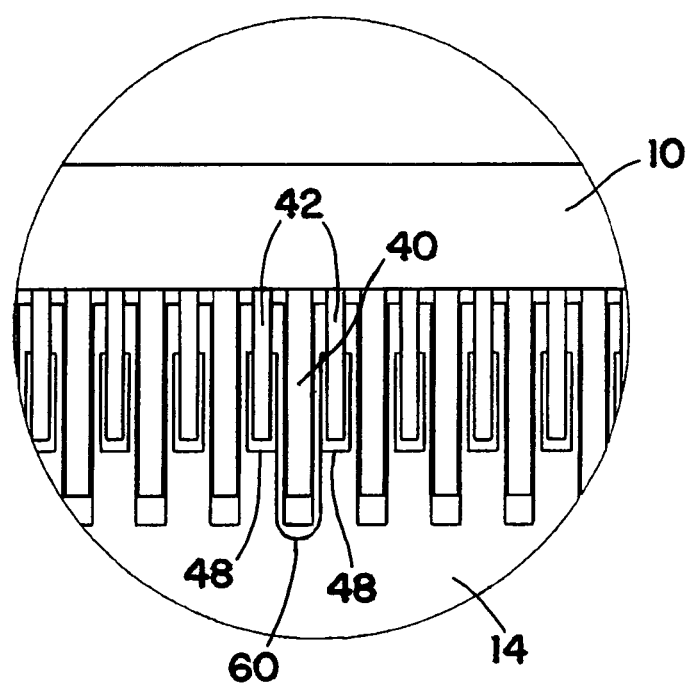
FIG. 5 is a magnified view of part of the portions shown in FIG. 3.

In addition the ribs 40 enter into the slots 58 as the connector 10 is engaged with the circuit board 14. The ribs 40 are located between adjacent combinations of the tails 42 and the contact pads 48. The ribs 40 provide improved electrical isolation between the pad-tail combinations, blocking the shortest gap between adjacent tails 42 and adjacent contact pads 48. The height of the ribs 40 (the extent in the direction orthogonal to the surface of the circuit board 14) considerably lengthens the isolation path above and below the ribs 40. FIG. 5 shows the shortest current isolation path, a path 60 around the distal end (free end) of the ribs 40, near the bottom of the slots 58. The combination of ribs 40 and the slots 58 thus provides an extended isolation path that prevents current leakage and voltage breakdown.

Many variants are possible regarding the above device and method. For example device may include any suitable number of contacts, as well as various configurations for the contacts.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A device comprising:
   a circuit board; and
   a connector mounted on an edge of the circuit board;
   wherein the circuit board has contact pads away from an edge of the circuit board that is closest to the connector;
   wherein the connector has ribs alternating with contact tails; and
   wherein the contact tails engage the contact pads;
   wherein the circuit board has slots that are between adjacent circuit board fingers; and
   wherein the slots have a depth that extends further from the edge than do the contact pads.

2. The device of claim 1, wherein the contact pads are on individual circuit board fingers.

3. The device of claim 1, wherein the slots are rectangular slots.

4. The device of claim 1, wherein the ribs enter the slots when the connector is coupled to the circuit board.

5. The device of claim 1, wherein the ribs are between adjacent contact pads, extending the isolation path between the adjacent contact pads.

6. The device of claim 1, wherein the ribs are parts of a plastic connector body of the connector.

7. The device of claim 6, wherein the connector body is a single molded plastic piece.

8. The device of claim 1, wherein the contact pads have respective conductive vias that electrically connect the conductive pads to circuitry of the circuit board.

9. The device of claim 8, wherein the circuitry is within (inside) the circuit board, as opposed to being on a surface of the circuit board.

10. The device of any of claim 1, wherein the combination of the ribs and the slots provides an extended isolation path preventing current leakage and voltage breakdown.

11. A circuit board comprising:
    circuit board fingers with slots therebetween; and
    contact pads, away from an edge of the circuit board, on the circuit board fingers;
    wherein the circuit board has slots that are between adjacent circuit board fingers; and
    wherein the slots have a depth that extends further from the edge than do the contact pads.

12. The device of claim 11, wherein the slots are rectangular slots.

* * * * *